(12) United States Patent
Murayama

(10) Patent No.: US 7,538,485 B2
(45) Date of Patent: May 26, 2009

(54) ORGANIC ELECTROLUMINESCENT DISPLAY PANEL AND PRODUCTION METHOD THEREOF

(75) Inventor: Koji Murayama, Shiga (JP)

(73) Assignees: Chi Mei Optoelectronics Corp., Tainan Science Based Industrial Park (TW); Kyocera Corporation, Kyoto (JP)

( * ) Notice: Subject to any disclaimer, the term of this patent is extended or adjusted under 35 U.S.C. 154(b) by 566 days.

(21) Appl. No.: 11/159,998

(22) Filed: Jun. 23, 2005

(65) Prior Publication Data
US 2005/0285512 A1   Dec. 29, 2005

(30) Foreign Application Priority Data
Jun. 25, 2004  (JP)  ............... 2004-187654

(51) Int. Cl.
*H01J 63/04* (2006.01)
*H01J 1/62* (2006.01)
(52) U.S. Cl. ............. 313/504; 313/483; 313/503; 313/505; 313/506
(58) Field of Classification Search ............. 313/504; 428/690
See application file for complete search history.

(56) References Cited

U.S. PATENT DOCUMENTS

| 5,834,893 | A | 11/1998 | Bulovic et al. |
| 6,091,195 | A * | 7/2000 | Forrest et al. ............... 313/504 |
| 6,650,045 | B1 * | 11/2003 | Forrest et al. ............... 313/504 |
| 6,656,611 | B2 * | 12/2003 | Tai et al. ..................... 428/690 |
| 6,833,667 | B2 | 12/2004 | Hamano et al. |
| 2003/0170493 | A1 * | 9/2003 | Chen et al. .................. 428/690 |

FOREIGN PATENT DOCUMENTS

JP   2003-257659    2/2002
WO   WO 01/41229 A1 *  6/2001

* cited by examiner

*Primary Examiner*—Nimeshkumar D. Patel
*Assistant Examiner*—Natalie K Walford
(74) *Attorney, Agent, or Firm*—Milde & Hoffberg, LLP

(57) ABSTRACT

An OLED display panel according to the present invention comprises: a substrate; a plurality of banks, each having a tapered shape of cross section in a traverse direction comprises by a pair of side surfaces, an upper surface and a bottom surface respectively connected to the side surfaces, the banks being arranged on a top surface of the substrate in side by side at an interval; and an electrode layer covering the top surface of the substrate between banks and the side surfaces of the banks adjacent to such top surface.

12 Claims, 4 Drawing Sheets

Bottom-emission structure

Top-emission structure

ORGANIC ELECTROLUMINESCENT DISPLAY PANEL AND PRODUCTION METHOD THEREOF

BACKGROUND OF THE INVENTION

1. Field of the Invention

The present invention relates to a display panel employing an organic electroluminescence (hereinafter referred to as OLED: Organic Light Emitting Diode) and a production method thereof, in particular to an OLED display panel having an improved light extraction efficiency and display contrast.

2. Description of Related Art

In an OLED display employing an OLED display panel, self-luminous OLED elements are arranged on a substrate, such as a glass substrate to show information by emitting the OLED elements. The OLED display is advantageously thin and light in weight, high in image quality, superior in dynamic image display, wide in the angle of view, and low in power consumption as compared with other types of flat-type displays. The OLED display, therefore, is considered an epoch-making flat-type display supporting the ubiquitous society.

OLED elements are generally configured by sandwiching at least one organic layer between an anode and a cathode. At least one organic layer herein described has a different structure and number of layers according to its element structure, but in many cases, the organic layer includes three to five layers of functional layers, such as a hole-transporting layer, a hole-injecting layer and/or an electron-transporting layer, and an electron-injecting layer or the like, which sandwich a light-emitting layer.

A hole is fed from the anode into a light-emitting layer and an electron is fed from the cathode into the light-emitting layer through the above-mentioned each functional layer by the application of a direct current voltage between two electrodes: the anode and the cathode. The electronic state of organic molecules included in the light-emitting layer is changed to the excited state by energy generated by a recombination of the hole and the electron in the light-emitting layer. Energy is emitted as light when this quite unstable electronic state falls to a ground state to emit organic light emitting diodes. Organic electroluminescence is referred to also as organic light emitting diode (OLED) because this emitting principle is common to the emitting mechanism of light emitting diode (LED).

A method of taking out luminance of an OLED display has two systems: bottom-emitting system and top-emitting system. As shown in FIG. 7(a), the bottom-emitting system takes out light from an insulating substrate side 2010. As shown in FIG. 7(b), the top-emitting system takes out light from a top surface layer side 1014.

Conventionally, for example, as shown in FIGS. 4(a) to 4(e), a top-emitting OLED display panel is manufactured as follows: (1) as shown in FIG. 4(a), a substrate 110 is prepared to deposit an anode layer 115 by sputtering or evaporation or the like. (2) As shown in FIG. 4(b), the anode layer 115 is patterned by a photolithographic method to form anode layers 114 for each pixel area by removing unnecessary part by etching. (3) As shown in FIG. 4(c), edge insulators 113 are formed between each anode layer 114 by patterning using the photolithographic method after forming a film by a spin coating method or the like. (4) As shown in FIG. 4(d), walls 118 are formed on the edge insulators 113 by patterning using the lithographic method after forming a film using the spin coating method or the like. (5) As shown in FIG. 4(e), organic layers 120 are formed using metal masks in a vacuum deposition method while performing patterning, and then cathodes are formed using a resistance heating method, an electron beam evaporation, and a sputtering method or the like.

To increase luminance of the OLED display, it becomes necessary to increase a current to be fed or to have a panel with superior efficiency. Improving the light extraction efficiency of the OLED display (amount of light which can be extracted from the light extracting side/total amount of emission from OLED elements) as much as possible is needed to prepare OLED elements with superior efficiency.

The thickness of the organic layer to cause light emission is up to 1,500 angstrom or so, so that as far as the light-emitting layer is concerned, its thickness is only some hundred angstrom or so, which is quite shorter than the emission wavelength. Such light emission caused within the layer spreads to all directions of solid angle $\Omega=4\pi$ within the film. As schematically shown in FIG. 8, generally, in a top-emitting OLED display 1001, light emitted to an anode side 1012 is reflected on the anode 1012 to be emitted from a cathode side 1014 at the same time when light is emitted through the cathode 1014. In the bottom-emitting OLED display, respective roles of the anode 1012 and the cathode 1014 are opposite to those of the top-emitting OLED display.

As mentioned above, since light is emitted within the layer with a sufficient thinness, as shown in FIG. 6, the rate of emission of total reflection becomes extremely high, unless the refractive index in the interface between the emitting layer and the functional layer or between the functional layers is sufficiently increased. Light totally reflected is propagated inside the organic layer 120 so that the light may pass a waveguide to emit in parallel with the interface between the layers. The luminous efficiency against incident energy of such light in parallel with the interface between the layers is deteriorated due to no contributing emission components to the luminance of the display.

As shown in FIG. 5, in the conventional structure of OLED elements, there are several polymer structures around the emitting region of the OLED elements 103, such as edge insulators 113 to prevent the anodes 114 and the cathodes 122 being short, and walls 118 to divide the cathodes 122 at a certain position. Although there are some colored ones among these polymer structures, many of them do not have a sufficient optical density (OD) to block light. Accordingly, these polymer structures function like an optical waveguide by incoming light that is in parallel with the above-mentioned interface between the layers, which results in the passing of light.

Such light does not greatly contribute to such contrast that is evaluated by the OLED display panel in total black versus total white. However, there were problems with checker patterns, such as ANSI contrast and the damage of effective contrast ratio that is difficult to evaluate by the figure at the time of showing ordinary image.

Cited document 1 discloses an invention having a mesa structure in which OLED elements are sandwiched between inverted V-like structures having a refractive index higher than the emitting layer. According to the invention described in the cited document 1, an image forming apparatus which is excellent in visibility and which can maintain a light emission performance with a high degree of efficiency can be provided.

(Cited Document 1)

Japanese Publication No. 2003-257659 (Paragraphs 53 to 56)

When compared to a conventional OLED display panel in which all structures are formed of polymer, the mesa structure has, however, various restrictions to materials used for an inverted V-like structure and a method for forming an OLED element, which results in complicated production processes and high production costs.

Although examples of materials having light reflectivity for the inverted V-like structure include metal materials and conducting materials, this structure has difficulty in effectively preparing an OLED panel without any modifications due to defects, such as a short of the anode and the cathode around pixels. Further, the materials may be optically transparent, but they have a problem with little effects of improving the above-mentioned effective contrast ratio.

Thus, it is an object of the present invention to provide an OLED display panel having an electrode structure capable of forming peripheral structures, such as walls by polymer as well as simultaneously improving the brightness and the contrast because of preventing an emission component which has been conventionally useless parallel to an electrode surface from intruding into a polymer structure by releasing the parallel emission component in a direction vertical to the electrode surface.

An OLED display panel according to the present invention comprises: a substrate; a plurality of banks, each having a tapered shape of cross section comprised by a pair of side surfaces, an upper surface and a bottom surface respectively connected to the side surfaces, the banks being arranged on a top surface of the substrate in side by side at an interval; and an electrode layer covering the top surface of the substrate between banks and the side surfaces of the banks adjacent to such top surface. The banks may be formed of polymer. And an angle formed by the bottom surface and one of the side surfaces is preferably not less than 40° degrees and not more than 50°. The insulating film is preferably formed of polymer, such as acrylic polymer and polyimide polymer having a visible light transmittance of not less than 95%.

SUMMARY OF THE INVENTION

A method for producing an OLED display panel according to the present invention comprises the steps of: preparing a substrate; forming a plurality of banks on a top surface of the substrate, each of banks having a tapered shape of cross section comprised by a pair of side surfaces, an upper surface and a bottom surface respectively connected to the side surfaces, the banks being arranged in side by side at an interval; and forming an electrode layer covering the top surface of the substrate between the banks and the side surfaces of the banks adjacent to the top surface. The method for producing an OLED display panel of the present invention further includes the step of laminating an organic layer and a second electrode layer on the insulating layer and the electrode layer in order, in which the end of the second electrode layer is preferably positioned so as not to cover the end of the insulating layer.

DESCRIPTION OF THE PREFERRED EMBODIMENTS

Figure 1:
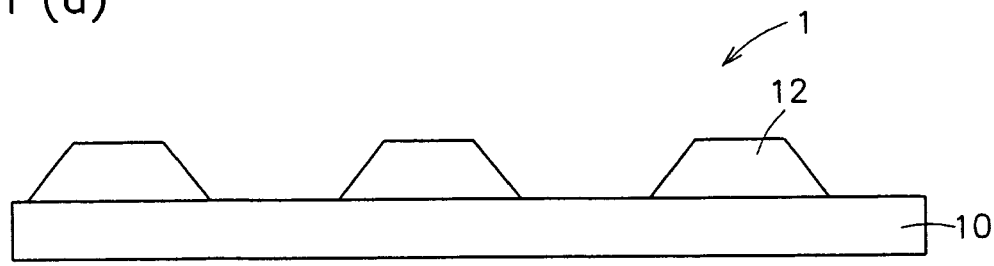
FIG. 1(a) is a cross-sectional view illustrating the first production process of an OLED display panel of the present invention.
FIG. 1(b) is a cross-sectional view illustrating the second production process of an OLED display panel of the present invention.
FIG. 1(c) is a cross-sectional view illustrating the third production process of an OLED display panel of the present invention.
FIG. 1(d) is a cross-sectional view illustrating the fourth production process of an OLED display panel of the present invention.
FIG. 1(e) is a cross-sectional view illustrating the fifth production process of an OLED display panel of the present invention.
Figure 1:
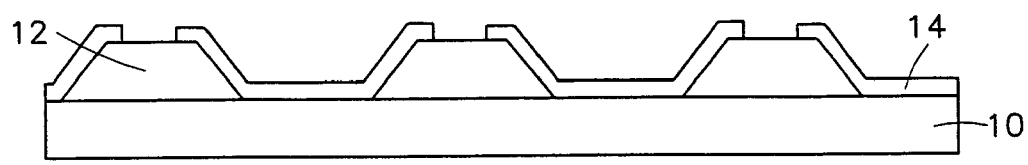
Figure 1:
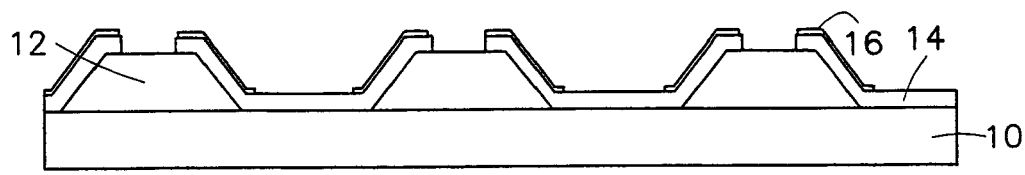
Figure 1:
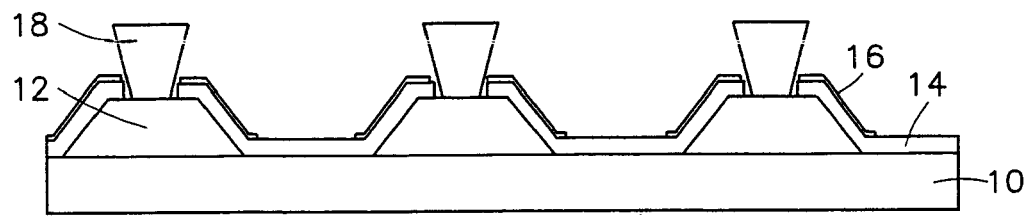
Figure 1:
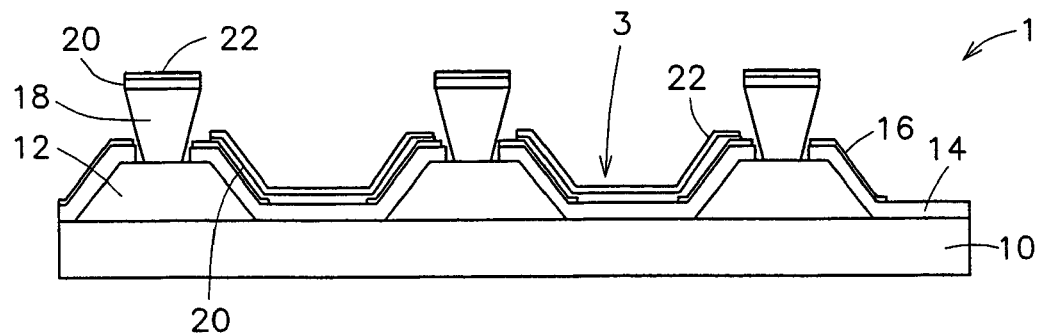

As shown in FIG. 1(a), an OLED display panel 1 of the present invention comprises: a substrate 10; and a plurality of polymer banks 12 (correspond to banks) arranged in side-by-side spaced relationship on the substrate 10. The polymer banks 12 have two sides, a top surface and a bottom surface, in which each of their cross-section in a traverse direction is in a slim tapered shape in the upper direction on the substrate 10, and an angle formed by the bottom surface and one of the side surfaces is preferably not less than 40° and not more than 50°, more preferably around 45°. The plurality of polymer banks 12 may be arranged in a stripe state in uni-direction in side-by-side spaced relationship, but may be formed in a matrix form surrounding OLED elements 3 shown in FIG. 1(e). Further, the polymer banks 12 can be substituted by polymer used as conventional edge insulators. Furthermore, in embodiments of the present invention described below, banks are referred to as polymer banks, an electrode layer is referred to as an anode, an insulating film is referred to as a thin film polymer, and a second electrode layer is referred to as a cathode.

In addition, as shown in FIG. 1(c), in the OLED display panel 1 of the present invention, oblique structured anodes 14 (corresponds to electrode layers) are formed with the substrate 10 between the adjacent polymer banks 12 and the sides faced each other to the adjacent polymer banks 12 covered. The oblique structured anodes 14 are covered with thin film polymers 16 (corresponds to insulating films). These thin film polymers 16 prevent cathodes 22 (correspond to second electrode layers) and the anodes 14 from being short outside the region where organic layers 20 are formed and each end of the thin film polymers 16 is positioned more outside (wall side) of each end of the cathodes 22. When the polymer banks 12 are formed in a state of surrounding the OLED elements 3 in a matrix form, the anodes 14 and the thin film polymers 16 are laminated on four sides of the polymer banks 12 surrounding the OLED elements 3.

Additionally, walls 18 are formed on the top surface of the polymer banks 12 along the polymer banks 12 and the organic layers 20 and the cathodes 22 are formed on one side of the substrate 10 by vacuum deposition or the like. The height of the polymer banks 12 is sufficiently higher than the film thickness of the anodes 14, the organic layers 20, and the cathodes 22 laminated on the substrate 10, which is not less than 1,000 nm.

The OLED display panel 1 in this embodiment is a top-emitting type and an insulating substrate (corresponds to a substrate), such as non-alkali glass is used as the substrate 10, and the anodes 14 are formed of a light reflecting Al mixture and Cr or the like. The cathodes 22 are transparent electrodes because of being respectively located on the surface where luminance is taken out and are formed of MgAg thin films, ITO (Indium Tin Oxide), and IZO (Indium Zinc Oxide) or the like.

The polymer banks 12 and the walls 18 are formed of polymer-system acrylic and polyimide photoresist or the like. As mentioned above, some of these polymer structures are colored, but many of them do not have a sufficient OD value to block light. Accordingly, these polymer structures, such as the polymer banks 12 and the walls 18 function like optical waveguides by incoming light, which results in the passing of the light through the polymer structures.

The thin film polymers 16 are formed of acrylic and polyimide photoresist or the like. The thickness of the thin film polymers 16 is preferably not less than 100 angstrom and not more than 3,000 angstrom. The reason for this is that the uniformity in film thickness would become easily unstable and electrical insulating effects tend to be lower when the thickness of the thin film polymers 16 is less than 100 angstrom. On the contrary, the visible light transmittance may become lower when the thickness of the thin film polymers 16 is greater than 3,000 angstrom. Further, the visible light transmittance of the thin film polymers 16 is preferred to be not lower than 95% to effectively take out most of light reflected on the anodes 14 positioned at the area just below the thin film polymers 16. In addition, to have a visible light transmittance of not lower than 95%, materials to be used and the film thickness of the thin film polymers 16 need to be adjusted. The less the colored components are, the smaller the film thickness is, the higher the visible light transmittance becomes. For example, an acrylic material and the like may be used as the thin film polymers 16 or materials, such as novolac-system and polyimide-system materials which have sufficiently little colored components may be used or a material with low density in which the film thickness can be thinly applicable may be used in the case of being a little colored materials, and the application method, such as printing may be applied to have a visible light transmittance of not lower than 95%.

In the OLED display panel 1 with such configuration, upon the application of an appropriate current higher than the emission threshold current between the anodes 14 and the cathodes 22 which are transparent electrodes, each OLED display panel layer 20 emits fluorescence or phosphorescence. This emitting light spreads to all of the directions of cubic angle $\Omega=4\pi$ to be emitted. Light emitted substantially vertical to the substrate 10 (hereinafter referred to as vertical output component) propagates in the direction of the anodes 14 and the cathodes 22. And the vertical output component in the direction of the cathodes 22 is taken out from the cathodes 22. Light which goes straight in the direction of the anodes 14 is reflected on the anodes 14 made of a reflective material to be taken out from the cathodes 22 after propagating in the direction of the cathodes 22. The film thickness and the refractive index of an emitting layer and an functional layer are set in an appropriate range so that reflected light on these anodes 14 can be taken out from the cathodes 22 by strengthening light emitted from the organic layers 20 to the direction of the cathodes 22.

Figure 2:
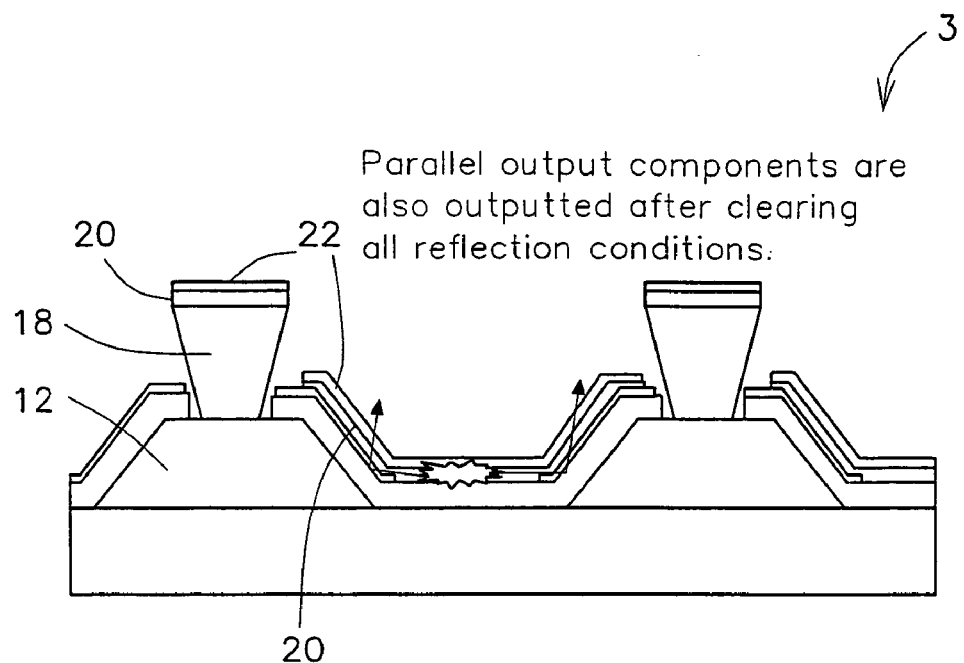
FIG. 2 is a cross-sectional view of a unit pixel area of an OLED display panel of the present invention.
Figure 3:
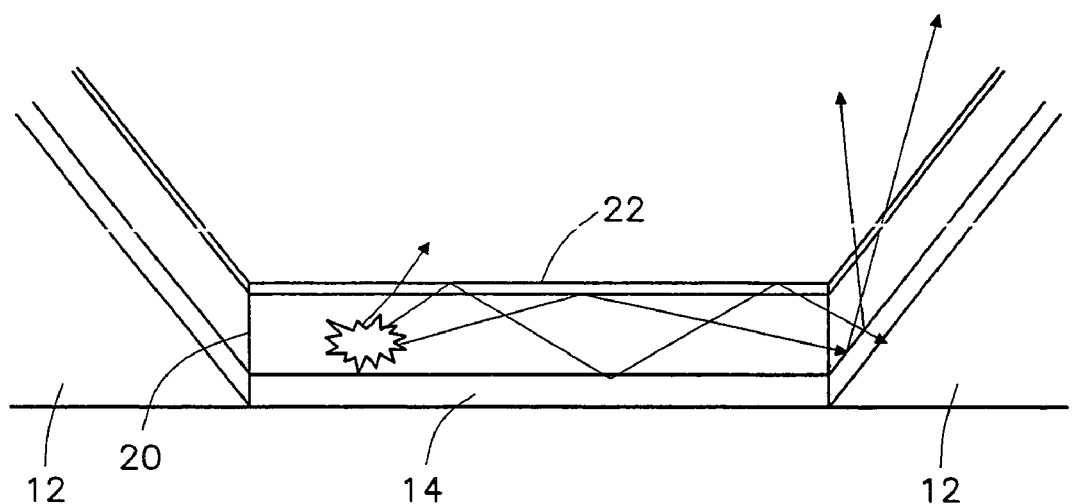
FIG. 3 is a cross-sectional view showing a light path within OLED display elements of the present invention.
Figure 4:
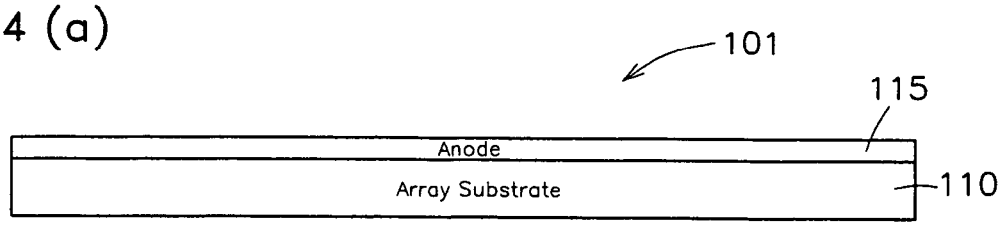
FIG. 4(a) is a cross-sectional view illustrating the first production process of a conventional OLED display panel.
FIG. 4(b) is a cross-sectional view illustrating the second production process of a conventional OLED display panel.
FIG. 4(c) is a cross-sectional view illustrating the third production process of a conventional OLED display panel.
FIG. 4(d) is a cross-sectional view illustrating the fourth production process of a conventional OLED display panel.
FIG. 4(e) is a cross-sectional view illustrating the fifth production process of a conventional OLED display panel.
Figure 4:
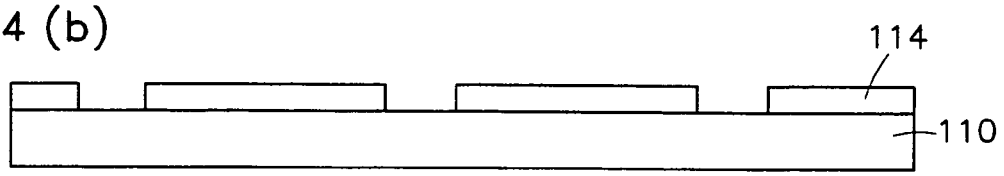
Figure 4:
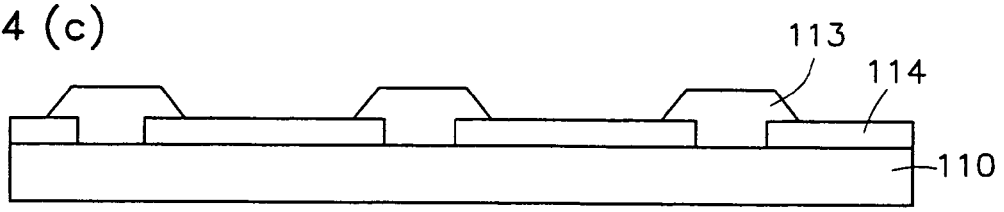
Figure 4:
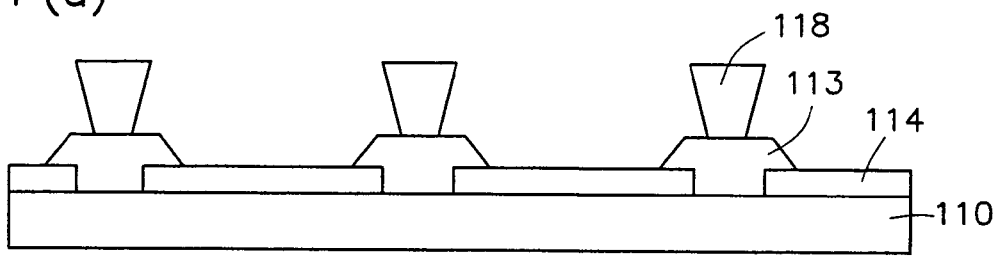
Figure 4:
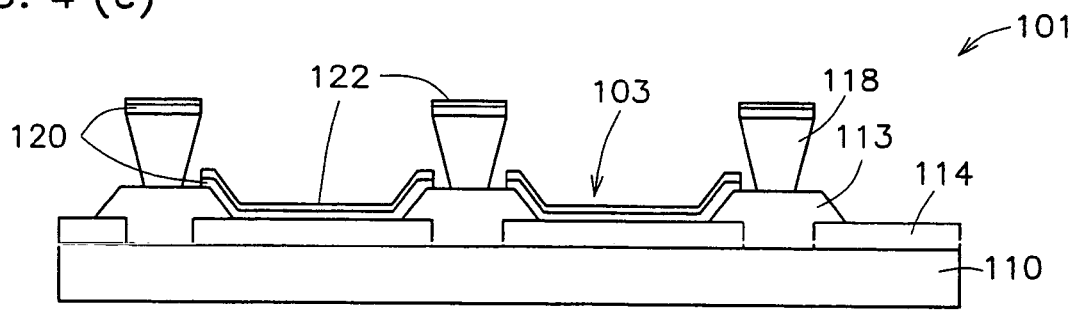
Figure 5:
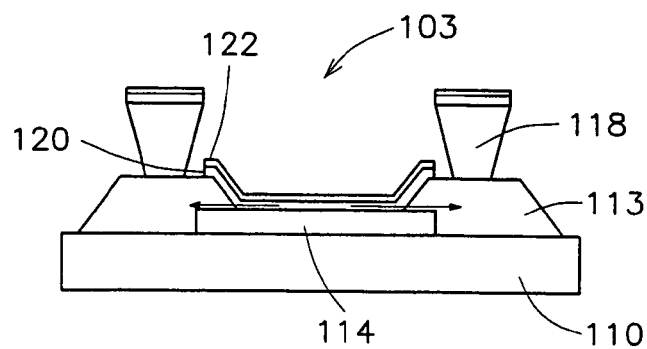
FIG. 5 is a cross-sectional view of a unit pixel area of a conventional OLED display panel.
Figure 6:
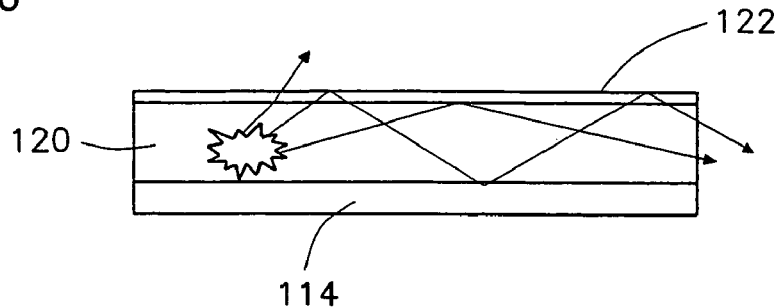
FIG. 6 is a cross-sectional view illustrating the state of total reflection within conventional OLED display elements.
Figure 7:
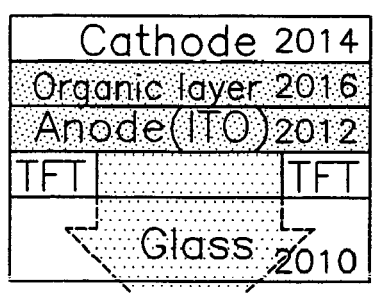
FIG. 7(a) is a cross-sectional view illustrating an emitting method of a bottom-emitting active OLED display.
FIG. 7(b) is a cross-sectional view illustrating an emitting method of a top-emitting active OLED display.
Figure 7:
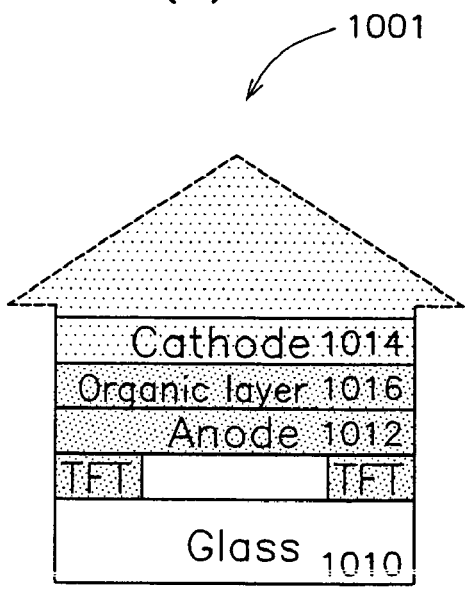
Figure 8:
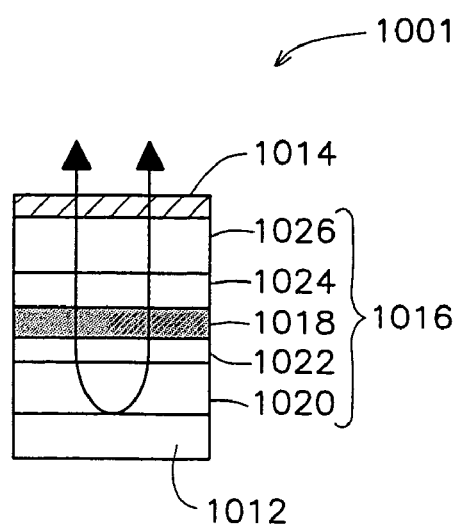
FIG. 8 is a cross-sectional view illustrating an emitting light path of a top-emitting OLED display.

Additionally, light totally reflected on the interface between the emitting layer and the functional layer or the functional layers out of the light isotropically emitted like the above is light emitted from the organic layers 20 substantially parallel to the substrate 10 (hereinafter referred to as parallel output component). As shown in FIG. 3, this parallel output component reflects on the oblique-structured anodes 14 formed on sides of the polymer banks 12 as well in the direction of the cathodes 22 to be taken out from the cathodes 22 which are transparent electrodes, as shown in FIG. 2. Accordingly, it is possible to effectively restrict incoming light to the polymer structures, such as polymer banks 12 and the walls 18. Further, as mentioned above, it is preferable to form an angle of approximately 45° by each side of the polymer banks 12 and the substrate 10 so that light can be effectively taken out.

The OLED display panel 1 of the embodiments having the above-mentioned structure is manufactured by the processes below. Production procedures for the OLED display panel 1 will be now described as below by reference of FIGS. 1(*a*) to 1(*e*).

(1) As shown in FIG. 1(*a*), a substrate 10 is prepared and polymer banks 12 are formed by using a photolithographic method or the like.

(2) An anode layer is deposited all over the substrate 10 and as shown in FIG. 1(*b*), anodes 14 are formed per each pixel area by etching using a well-known method.

(3) Similarly, sufficiently thin film polymers 16 are deposited and as shown in FIG. 1(*c*), the thin film polymers 16 are etched so as to cover the anodes 14 portions formed by covering the sides of the polymer banks 12 to be processed to a predetermined pattern.

(4) As shown in FIG. 1(*d*), walls 18 are formed on the top surface of the polymer banks 12 by using the photolithographic method or the like.

(5) As shown in FIG. 1(*e*), organic layers 20 and cathodes 22 are sequentially laminated on the thin film polymers 16 and the anodes 14 by vacuum evaporation. There is an advantage of surely preventing a short between the cathodes 22 and the anodes 14 by forming the cathodes 22 in such a manner so as not to cover the ends of the thin film polymers 16.

The OLED display panel 1 according to the present invention has characteristics in that the anodes 14 are also formed on the sides of the polymer banks 12 and the oblique-structured anodes 14 arranged on the sides of the polymer banks 12 and the substrate 10 form an angle of approximately 45°. The light extraction efficiency of the parallel output component is significantly increased because its emission component is altered to the direction vertical to the organic layers 20 by receiving a reflection on the oblique-structured anodes. Further, total reflection conditions are greatly relaxed, so that the necessity of luminance reflective index layer formed to improve the light extraction efficiency is reduced. Thus, the configuration and the selection of a light-emitting film structure and the materials become less restricted, so that the development intended for further improving inherent element characteristics, such as luminous efficiency, life-cycle, and color purity becomes possible.

Furthermore, reflection of the parallel output component on the oblique-structured anodes 14 prevents light from leaking to the polymer structures, such as the polymer banks 12 and the walls 18, which results in improvement of contrast.

The embodiments of the OLED display panel of the present invention have thus been described, but the OLED display panel of the present invention is not limited to the above-mentioned embodiments. Cathodes may be formed on a substrate, and organic layers may be laminated in the order of an electron-injecting layer and/or an electron-transporting layer and a light-emitting layer and/or a hole-transporting layer and/or a hole-injecting layer, and anodes may be formed on the top surface. In this case, cathodes need to be made of a light reflective material and anodes need to be transparent electrodes.

The organic layers of the OLED display panel according to the present invention may be formed of either low-molecular organic materials or high-molecular organic materials. The present invention may be applied to all top-emitting OLED display panels.

Further, the OLED display panel of the present invention may be a two-color panel, such as white and black or may be a full colored display, such as red, green, and blue. Alternatively the present invention may be applied even if the emitting colors in each sub-pixel are more than 4 kinds.

Furthermore, in the OLED display panel of the present invention, functional layers do not necessarily include all of the hole-transporting layer, the hole-injecting layer, the electron-transporting layer and the electron-injecting layer, and especially, in the case of high-molecular emitting layer, the above-mentioned functional layers are not particularly needed.

Moreover, the OLED display panel of the present invention may be either passive-system or active-system. The present invention may be applied to the OLED display panel in both systems.

In addition, the material forming each component of the OLED display panel is not limited to the above-mentioned material. All materials that can replicate characteristics of the above-mentioned each component are included in the scope of the invention in this application.

In the above-mentioned embodiments, the anodes, the organic layers, and the cathodes are laminated in order from the surface side of the substrate, but instead of this, the cathodes, the organic layers, and the anodes may be laminated in order. In this case, unlike the above-mentioned embodiments, it is not the anodes that are formed in such a manner that the sides where adjacent polymer banks are faced are covered, but it is the cathodes, and the electrode layer includes the cathodes and the second electrode layer includes the anodes.

Further, in the above-mentioned embodiments, polymer banks are used as banks and thin film polymers are used as insulating layers, but they may be insulating materials other than polymers. It is preferable that the insulating film is preferably an insulating material and is formed of a material excellent in optical transparency.

An OLED display of the present invention is capable of increasing the light extraction efficiency by developing an electrode structure for releasing a wasted emitting component parallel to the surface of electrodes in a direction vertical to the surface of the electrodes. Further, the application of the electrode structure according to the present invention can prevent light from intruding into the polymer structures around the light-emitting area even when the structures, such as walls and edge insulators are formed of polymer as per conventional manner. Accordingly, the OLED display of the present invention is simultaneously capable of improving brightness and contrast.

Further, total reflection conditions are greatly relaxed, so that the necessity of luminance reflective index layer previously formed to improve the light extraction efficiency is reduced. Thus, the configuration and the selection of a light-emitting film structure and the materials become less restricted, so that the development intended for further improving inherent element characteristics, such as luminous efficiency, life-cycle, and color purity becomes possible.

While the embodiments of the present invention have thus been described with reference to the drawings, it should be understood that the present invention be not limited to the embodiments shown in the drawings. Various changes, modifications, and improvements can be made to the embodiments on the basis of knowledge of those skilled in the art without departing from the scope of the present invention.

What is claimed is:

1. An organic electroluminescent display panel comprising:
   a substrate;
   a plurality of banks, each having a tapered shape of cross section comprised by a pair of side surfaces, an upper surface and a bottom surface respectively connected to the side surfaces, the banks being arranged on a top surface of the substrate in side-by-side relationship at an interval;
   a first electrode layer covering the top surface of the substrate between the banks and the side surfaces of the banks adjacent to such top surface;
   a pair of insulating layers coating a portion of the first electrode layer, said portion covering the side surfaces of the banks, each of the insulating layers having one end on a respective bank;
   an organic layer laminated on the insulating layer and the first electrode layer, the organic layer having two ends which are disposed on the banks;
   a second electrode layer laminated on the organic layer, the second electrode layer having two ends which are disposed on the banks; and
   a plurality of walls, each standing on the upper surface of the banks;
   wherein the walls have an upper surface wider than a lower surface; and
   wherein said two ends of the second electrode layer and the organic layer are positioned so as not to cover said one end of the respective insulating layer.

2. The organic electroluminescent display panel according to claim 1, wherein the banks are formed of polymer.

3. The organic electroluminescent display according to claim 1, wherein an angle formed by the bottom surface and one of the side surfaces of the banks is not less than 40° and not more than 50°.

4. The organic electroluminescent display panel according to claim 1, wherein a thickness of the insulating layer is not smaller than 100 angstrom and not greater than 3,000 angstrom.

5. The organic electroluminescent display panel according to claim 1, wherein the insulating layer is formed of polymer.

6. The organic electroluminescent display panel according to claim 1, wherein the insulating layer has a visible light transmittance of not less than 95%.

7. The organic electroluminescent display panel according to claim 1, wherein the insulating layer is formed by a photoresist.

8. The organic electroluminescent display panel according to claim 1,
   wherein a portion of the second electrode layer covers the upper surface of the walls.

9. A method for producing an organic electroluminescent display panel comprising the steps of:
- preparing a substrate;
- forming a plurality of banks on a top surface of the substrate, each of banks having a tapered shape of cross section comprised by a pair of side surfaces, an upper surface and a bottom surface respectively connected to the side surfaces, the banks being arranged in side-by-side relationship at an interval;
- forming a plurality of walls on the upper surface of the banks;
- forming a first electrode layer covering the top surface of the substrate between the banks and the side surfaces of the banks adjacent to such top surface;
- forming a pair of insulating layers coating a portion of the first electrode layer, said portion covering the side surfaces of the banks, each of the insulating layers having one end on a respective bank;
- forming an organic layer laminated on the insulating layer and the first electrode layer, the organic layer having two ends which are disposed on the banks;
- forming a second electrode layer laminated on the organic layer, said second electrode layer having two ends which are disposed on the banks; and
- wherein said two ends of the second electrode layer and the organic layer are positioned so as not to cover said one end of the respective insulating layer.

10. The method according to claim 9, wherein the banks are formed of polymer.

11. The method according to claim 9, wherein an angle formed by the bottom surface and one of the side surfaces of the banks is not less than 40° and not more than 50°.

12. The method according to claim 9, wherein the insulating layer is formed of polymer.

* * * * *